(12) United States Patent
Pascucci

(10) Patent No.: US 7,023,728 B2
(45) Date of Patent: Apr. 4, 2006

(54) SEMICONDUCTOR MEMORY SYSTEM INCLUDING SELECTION TRANSISTORS

(75) Inventor: Luigi Pascucci, Milan (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 10/746,555

(22) Filed: Dec. 24, 2003

(65) Prior Publication Data

US 2004/0190335 A1 Sep. 30, 2004

(51) Int. Cl.
*G11C 16/04* (2006.01)

(52) U.S. Cl. .......................... 365/185.01; 365/185.07; 365/185.08

(58) Field of Classification Search ........... 365/185.01, 365/185.03, 154, 185.07, 185.08

See application file for complete search history.

(56) References Cited

U.S. PATENT DOCUMENTS

| | | | |
|---|---|---|---|
| 5,111,427 A | * 5/1992 | Kobayashi et al. | 365/185.07 |
| 5,523,971 A | * 6/1996 | Rao | 365/185.07 |
| 5,790,466 A | 8/1998 | Hotta | |
| 6,284,585 B1 | 9/2001 | Camerlenghi et al. | |
| 6,331,947 B1 | * 12/2001 | Widdershoven et al. | 365/185.08 |
| 6,404,678 B1 | 6/2002 | Lin | |

FOREIGN PATENT DOCUMENTS

| | | |
|---|---|---|
| EP | 0 601 207 | 6/1994 |
| EP | 1 262 995 | 12/2002 |
| GB | 2 157 489 | 10/1985 |

OTHER PUBLICATIONS

European Search Report for EP 02 42 5796 dated Apr. 9, 2003.

* cited by examiner

*Primary Examiner*—Anh Phung
*Assistant Examiner*—N Nguyen
(74) *Attorney, Agent, or Firm*—Lisa K. Jorgenson; Bryan A. Santarelli; Graybeal Jackson Haley LLP

(57) ABSTRACT

A semiconductor memory system comprising a memory matrix including a plurality of memory cells arranged in rows and columns and connected to a plurality of column lines, each memory cell of the same column having a first and a second terminal connected to a first and a second column line respectively.

Furthermore, the memory system comprises a first and a second conduction line which can be connected to said first and second column lines, and generating means provided with at least a first and a second output line, making available a first and a second reading/writing voltage to said first and second terminal respectively.

The memory system also comprises at least a first and a second selection transistor connected to the same command line and having corresponding operative terminals connected directly to the first and to the second output lines respectively and corresponding cell terminals connected directly to the first and to the second conduction lines respectively.

29 Claims, 6 Drawing Sheets

FIG. 6

| Main-> | 0 | 1 | 2 | 3 |
|---|---|---|---|---|
| Rd | Bias | V_Rd | Gnd | ∼ |
|  | Gnd | V_Rd | Bias | ∼ |
|  | ∼ | Bias | V_Rd | Gnd |
|  | ∼ | Gnd | V_Rd | Bias |
|  | ⋮ | ⋮ | ⋮ | ⋮ |
| Pg | V_Pg | Gnd | ∼ | ∼ |
|  | Gnd | V_Pg | ∼ | ∼ |
|  | ∼ | V_Pg | Gnd | ∼ |
|  | ∼ |  | V_Pg | ∼ |
|  | ⋮ | ⋮ | ⋮ | ⋮ |
| Er_All (All_Sel=1) | V_Er | ∼ | V_Er | ∼ |
|  | ∼ | V_Er | ∼ | V_Er |
| (word_Er L) | V_Er | ∼ | V_Er | ∼ |
| (word_Er R) | ∼ | V_Er | ∼ | V_Er |
| (Byte_Er L) | V_Er | ∼ | ∼ | ∼ |
| (Byte_Er L) | ∼ | ∼ | V_Er | ∼ |
| (Byte_Er R) | ∼ | V_Er | ∼ | ∼ |
| (Byte_Er R) | ∼ | ∼ | ∼ | V_Er |

SEMICONDUCTOR MEMORY SYSTEM INCLUDING SELECTION TRANSISTORS

PRIORITY CLAIM

This application claims priority from European patent application No. 02425796.6, filed Dec. 24, 2002, which is incorporated herein by reference.

TECHNICAL FIELD

The present invention refers generally to the field of semiconductor memories and particularly to a memory system which uses selection transistors to select suitable column lines of the memory itself.

BACKGROUND

As is known, in order to select a generic cell of the memory matrix, for example, during the reading step, it is necessary to select the row to which the cell belongs applying a pre-established potential to a corresponding row line or word line. Similarly, the matrix column corresponding to the cell is selected by a selector or multiplexer which enables a column line (bit line), so connecting it to a reading circuit with which it is possible to read the data contained in the cell, for example performing a current type reading.

In the case of a non-volatile type memory composed of a NOR type cell matrix, the multiplexer accesses one, and just one, bit line for each cell selected. Generally, said multiplexer is made of multi-line structures which select, by means of MOS transistors, the pre-established bit line among a plurality of column lines. The gate terminal of the transistors used in the multiplexer is connected to a respective command line to which a voltage level signal, suitable to enable or disable the transistor itself, is sent. The voltage signal present on each command line is obtained by decoding an address signal. Given the great number of cells present in a matrix, the multi-line structures are arranged on various levels and the current which passes through the transistors of the multiplexer, during reading, produce voltage drops along the path from the reading circuit to the cell. In the case of NOR cells, the path of the current is not long and, consequently, the impedance on the drain terminal of the cell is not high.

If the matrix is composed of NROM type cells, a multiplexer, also in this case composed of transistors arranged on multi-line structures, always selects two different bit lines to access and read each cell. This is due to the particular way in which a NROM cell can be programmed or read. In particular, the NROM memory cells taken into consideration are dual bit cells where it is possible to store one bit for each side of the cell. The NROM dual bit cell 1, illustrated schematically in FIG. 1, has a $p^-$-type doped channel 2 disposed between two $n^+$-type regions, 3 and 4, which is accessed through the two bit lines selected by the multiplexer. The cell also comprises two areas 5 and 6, each of which can store an electric charge which defines one bit. In the dual bit cell 1, the areas 5 and 6 are within a nitride layer 7 interposed between a first oxide layer 8 and a second oxide layer 9, on which a polysilicon layer 10, corresponding to a gate terminal G, is disposed.

In order to program a first bit disposed in area 6, the region 3 (connected to a bit line) represents a drain region D, and the region 4 (connected to the other bit line) represents a source region SR. In order to program a second bit disposed in area,5, the region 4 represents a drain region D and the region 3 represents a source region SR.

In order to program the first bit disposed in area 6, a pre-established voltage (for example 9V) is applied to the gate G of the cell 1. Later, a pre-established programming voltage (for example 5V) is applied to the region 3, while the region 4 is connected to the ground potential GND (for example 0V). The voltages of the regions 3 and 4 are fixed in the opposite manner in order to program the second bit disposed in the area 5.

In order to read the first bit disposed in the area 6, the region 4 represents a drain region D and the region 3 represents a source region SR. In order to read the second bit stored in the area 5, the cell is read in the opposite direction and the region 4 represents the source region and region 3 represents the drain region.

In order to read the bit stored in the area 6 using a conventional reading technique such as current type sensing, a pre-established reading voltage (for example 9V) is initially applied to the gate G of the cell 1. Following this, a pre-established reading voltage (for example 1.5V–2V) is applied to the region 4, while the region 3 is connected to the ground potential GND (for example 0V). Said potential difference gives rise to a current which passes through the transistors of the bit line selector of the regions 3 and 4, the bit lines themselves, the cell under examination and is detected by a current sense amplifier. The intensity of the current detected, compared to a reference current, makes it possible to distinguish the bit stored in the area 6 of the cell. Conventionally, if the area 6 is without charge, i.e. it is not programmed, the current obtained is greater than the reference current and the stored bit is a logic 1. Vice-versa, if the area 6 is programmed, said current is less than the reference current and the bit stored is a logic 0.

The current reading procedure described is of the static type, but the discussed cell and the circuit solutions which will later be discussed in conjunction with embodiments of the invention are also suitable for dynamic current reading, as can be understood intuitively by the skilled-in-the-art.

In order to erase the bit stored in the area 6, the gate terminal G of the cell 1 is connected the ground potential GND (for example 0V), a pre-established voltage (for example 8V) is applied to the bit line relative to the region 3 leaving the bit line relative to the region 4 unconnected. The same procedure is followed in order to erase the area 5.

It has been noted that, compared to memories made with NOR cells, the path of the current during the reading and programming steps of a NROM cell doubles in length and, consequently, since the total impedance associated with the path increases, the voltage drops also double.

Furthermore, it has been observed that the NROM cells function correctly when, during the reading or programming step, the ground potential is effectively applied to the terminal which acts as source. In other words, in order to program and later read the cell correctly, the potential difference applied between the source and drain terminals of the cells must have a pre-established and controllable value. Concerning this, it has been noted that in conventional NROM memories, conditions may occur in which voltage drops on the current path prevent this from happening, giving rise to a spurious phenomenon called "Chisel effect" during the programming step. Said phenomenon compromises the separation of the charges at the ends of the cell. In fact, with reference to FIG. 1, undesired additional charges are conveyed from the region of channel 2 towards the center of the nitride layer 7. The presence of said charges prevents correct discrimination of the information contained in the cell during reading.

SUMMARY

An embodiment of the present invention improves memory performance, particularly but not exclusively, a NROM memory, overcoming the problems resulting from the impedances which derive from the source and drain terminals of each cell of the matrix.

BRIEF DESCRIPTION OF THE DRAWINGS

For a better understanding of the invention and its advantages, a non-limiting embodiment thereof is described below and is illustrated in the appended drawings, in which:

FIG. 6 shows a table summarizing the modes of reading, programming and erasing in a NROM memory matrix according to an embodiment of the invention.

DETAILED DESCRIPTION

Figure 2:
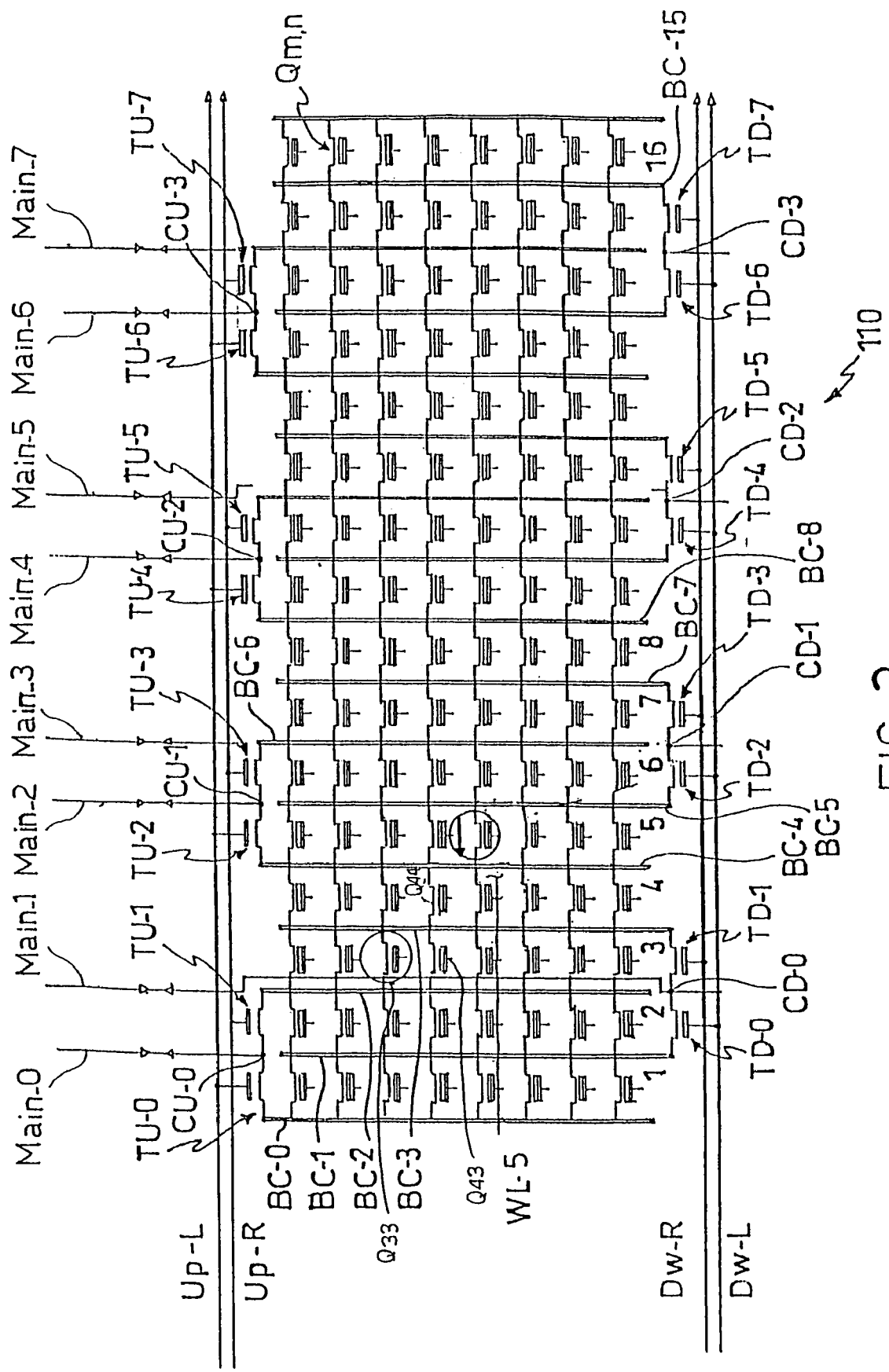
FIG. 2 shows, schematically, a memory matrix which uses cells like the one illustrated in FIG. 1.

The matrix or memory array 110 of the NROM type shown in FIG. 2 is described in patent application EP 01830345, which is incorporated by reference. The array 110 is formed on a semiconductor structure, for example, with a conventional technique of the contactless type.

Figure 1:
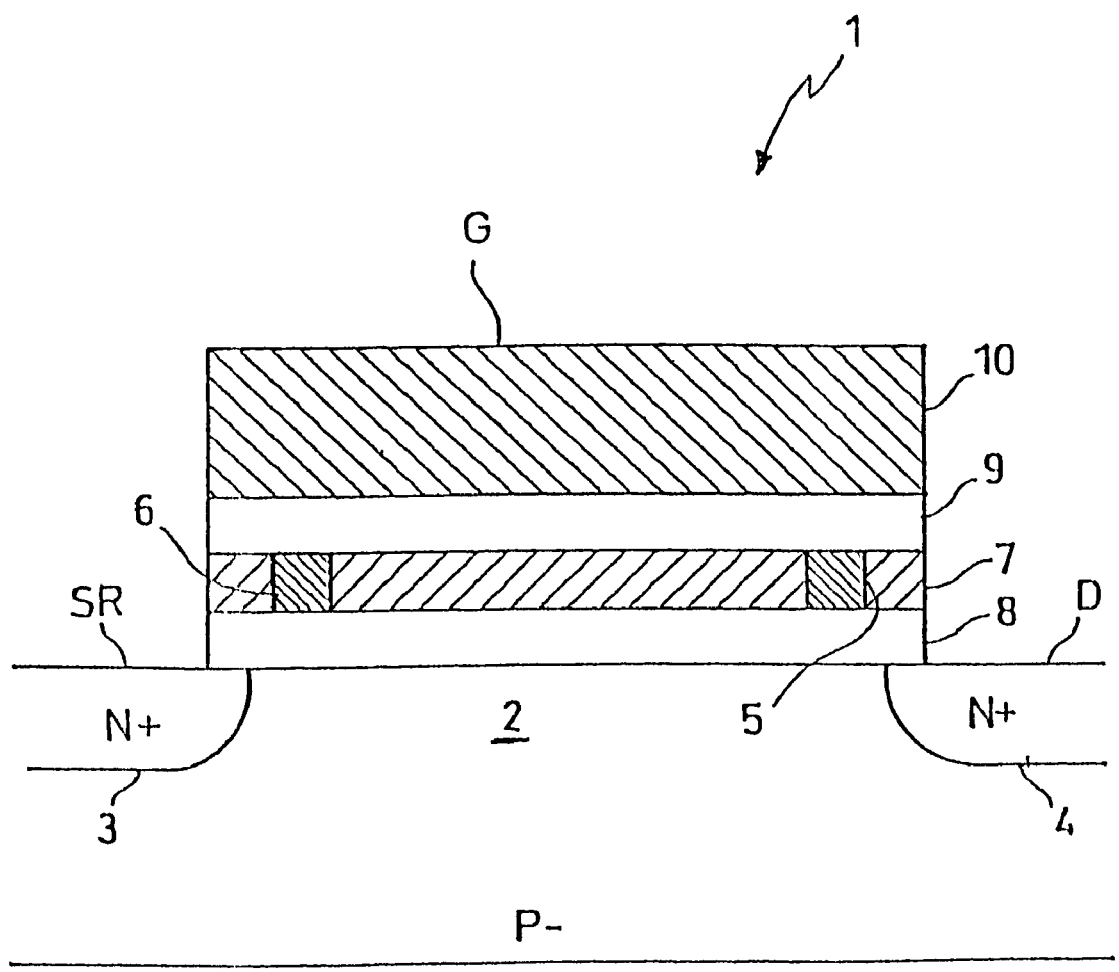
FIG. 1 shows, schematically, a dual bit NROM memory cell according to the prior art.

The array 110 comprises a plurality of memory cells $Q_{mn}$ arranged in rows and columns. In particular, the indexes "m" and "n" indicate the number of the row and the number of the column corresponding to the generic cell. Furthermore, the architecture of the memory array 110 is of the virtual ground type, meaning that the role of each bit line is not univocal. In fact, as previously described for the cell in FIG. 1, each bit line can operate as a source or drain electrode during subsequent reading and programming operations.

In the memory array 110, each memory cell $Q_{mn}$ has its respective gate terminal connected to a word line WL-m. For simplicity of representation, only a portion of the word line WL-5 which joins the gates of the cells of the fifth row is drawn.

Furthermore, the array 110 is provided with a plurality of column lines, hereinafter referred to as cell bit lines BC-0, BC-1, BC-2, . . . BC-i, . . . BC-N (with N equal to 16 in the example given) formed, for example, by a plurality of parallel diffusions which extend in the direction of the columns of the array 110. Each memory cell $Q_{mn}$ is connected, by its respective source and drain terminals, to two successive cell bit lines BC-i and BC-i+1 (with the index i which varies from 0 to N−1).

The memory array 110 comprises a plurality of main conduction lines or, more briefly, main bit lines, Main-0, Main-1, . . . Main-j, . . . Main-N/2−1 divided into even main bit lines, Main-2j, and odd main bit lines, Main-2j+1 (with the index j which varies from 0 to 3 in the example given). As can be seen in FIG. 2, the even main bit lines Main-2j are connected to a respective upper electrical contact CU-k (with the index k which varies from 0 to 3). On the other hand, the odd main bit lines Main-2j+1 are connected to a respective lower electrical contact CD-k (with the index k which varies from 0 to 3).

In FIG. 2, to simplify illustration, the odd index main bit lines Main-2j+1 to be connected to the respective lower electrical contact CD-k, are only partially illustrated. The only odd main bit line fully illustrated is the Main-1 which reaches lower contact CD-0.

A plurality of upper selection transistors TU-0, TU-1, . . . TU-j, . . . Tu-7 and a plurality of lower selection transistors TD-0, TD-1, . . . TD-j, . . . TD-7 belong to the structure of the memory array 110 and are, for example, N-MOS. In particular, the gate terminal of the even index upper selection transistors TU-2j (with index j which varies from 0 to 3) is connected to the left-hand upper selection line Up-L and the source-drain section is connected between one of the upper contacts CU-k (with k which varies from 0 to 3) and an even index cell bit line BC-4i (with index i which varies between 0 and 3). The gate terminal of the odd index upper transistors TU-2j+1 (with index j which varies from 0 to 3) is connected to the right-hand upper selection line Up-R and the source-drain section is connected between one of the upper contacts CU-k and an even index cell bit line BC-4i+2 (with index i which varies between 0 and 3). Similarly, the gate terminal of the even index lower selection transistors TD-2j is connected to the left-hand lower selection line Dw-L and the source-drain section is connected between one of the lower contacts CD-k (with k which varies between 0 and 3) and an odd index cell bit line BC-4i+1 (with index i which varies between 0 and 3). The gate terminal of the odd index lower transistors TD-2j+1 is connected to the right-hand lower selection line Dw-R and the source-drain section is connected between one of the lower contacts CD-k and an odd index cell bit line BC-4i+3 (with index i which varies between 0 and 3).

Said upper and lower selection transistors can be enabled/disabled to/from conduction on the basis of suitable address signals received from the memory.

The main bit lines Main-j can be connected electrically and selectively to the cell bit lines BC-i and to an external reading circuit (not shown in FIG. 2). In particular, each main bit line of even index Main-2j (with j which varies from 0 to 3) can be connected to one of the cell bit lines BC-4i or BC-4i+2 (with i which varies from 0 to 3) by activating the upper selection transistor TU-2j or TU-2j+1 respectively. Similarly, each main bit line of odd index Main-2j+1, can be connected to one of the cell bit lines BC-4i+1 or BC-4i+3 by activating the lower selection transistor TD-2j or TD-2j+1 respectively.

As will be described in greater detail below, each memory cell $Q_{mn}$ is accessed by the simultaneous activation of an upper selection transistor and a lower selection transistor.

For example, in order to access the memory cell $Q_{33}$, the word line corresponding to the third line is activated and current is brought to the cell bit line BC-2 and to the cell bit line BC-3. This access takes place by the activation of the upper right-hand selection line Up-R and the lower right-hand selection line Dw-R with consequent activation of the transistors TU-1 and TO-1 which connect the main bit line Main-0 to the cell bit line BC-2 and the main bit line Main-1 to the cell bit line BC-3 respectively. The $Q_{33}$ cell considered is a dual bit NROM which is read in the opposite direction to that in which it was programmed, thus each cell bit line will adopt the role of source terminal or drain terminal according to the type of operation to be performed.

Figure 3:
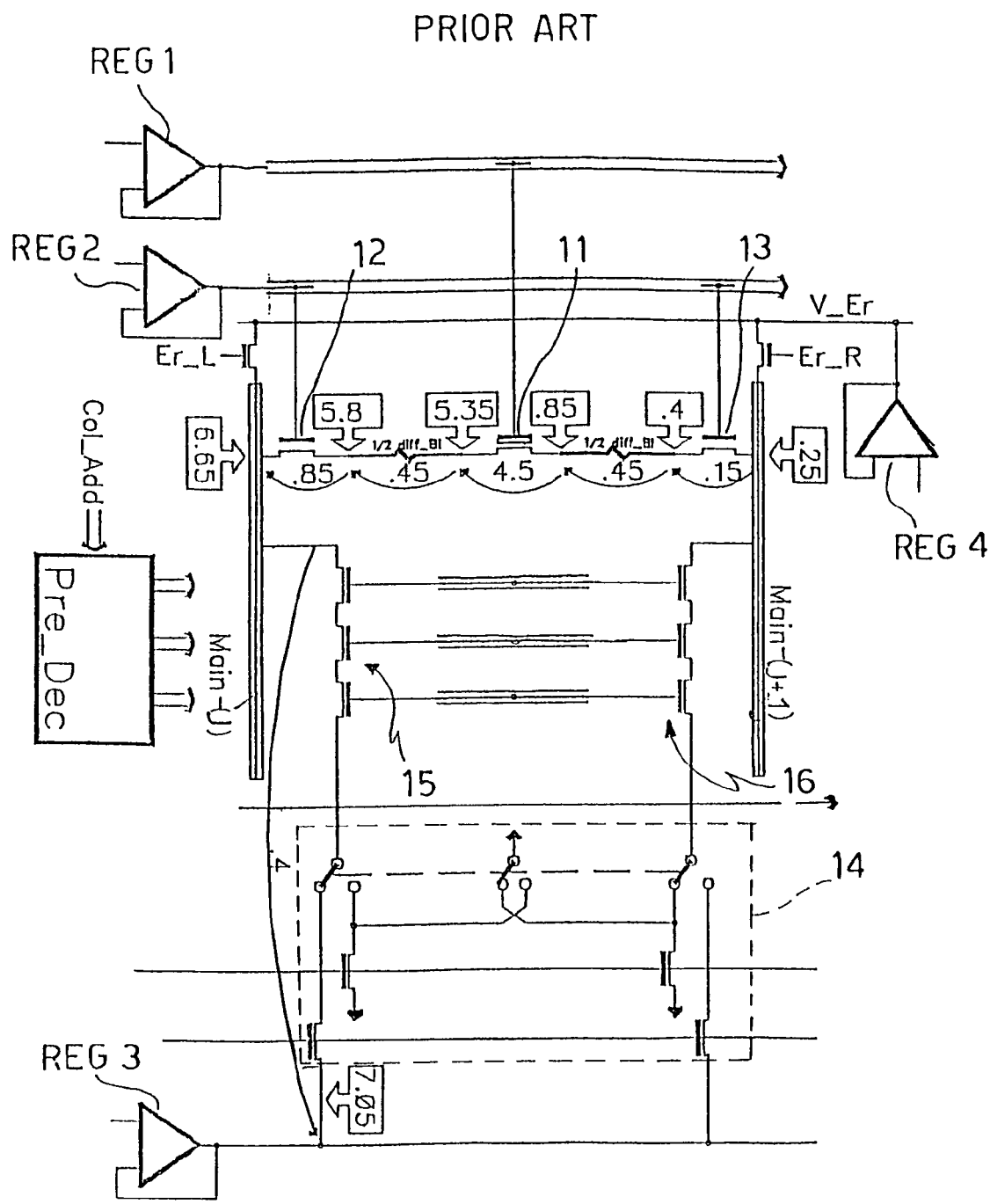
FIG. 3 shows, schematically, a simplified memory structure including a single dual bit NROM cell according to the prior art.

FIG. 3 shows, schematically and in a simplified manner, how the selection of a generic cell of the array 110 takes place, in the present state-of-the-art. In said figure, a generic dual bit NROM cell 11 is connected to a first main bit line Main-j and to a second main bit line Main-j+1, contiguous to the first; by means of a left-hand selection transistor 12 and a right-hand selection transistor 13 respectively. On the basis of the structure of the cell array 110 described, the left-hand transistor 12 is an upper/lower selection transistor if the index j is even/odd, while the right-hand transistor 13 is a lower/upper selection transistor if the index j is even/odd. Both said transistors are, for example, NMOS transistors.

Moreover, FIG. 3 shows four voltage regulators illustrated as voltage amplifiers that are buffer connected. In particular, the first regulator REG1 provides a voltage to the gate terminal of the dual bit NROM cell 11, the second regulator REG2 provides a voltage to the gate terminals of the left and right-hand transistors 12, 13, and the third regulator REG3 fixes the voltage on the first main bit line Main-j or on the second main bit line Main-j+1 according to the bit which is to be programmed or read in the cell 11. Finally, the fourth regulator REG4 is connected to the main bit lines Main-j and Main-j+1 by means of a first erasing transistor Er-L and a second erasing transistor Er-R respectively.

Furthermore, the structure 14 which comprises transistors and switches selects the suitable voltages (provided by the regulator REG3) to be applied to the first main bit line Main-j and to the second main bit line Main-j+1.

A further multiplexing level identifies the main bit lines Main-j and Main-j+1 among a plurality of main bit lines of the array on the basis of signals arriving from a pre-decoding circuit Pre_Dec. In particular, a first group of transistors 15 identifies the first main bit line Main-j and a second group of transistors 16 identifies the second main bit line Main-j+1.

The properties of the prior art illustrated in FIG. 3 can be deduced by analyzing, for example, the programming step of the cell NROM 11.

In order to program one of the bits of the cell 11, for example the left-hand one, on the basis of the programming methods described above in conjunction with FIG. 1, the regulator REG1 first applies a positive voltage (for example 9V) to the gate terminal of said cell. Similarly, the second regulator REG2 applies a positive voltage (for example 10V) to the gate terminal of the left-hand selection transistor 12 and the right-hand selection transistor 13, activating them for conduction. Subsequently, the ground potential GND (for example 0V) is applied to the second main bit line Main-j+1 by means of the second group of transistors 16 and, at the same time, the third regulator REG3 applies a positive voltage (for example 8V) to the first main bit line Main-j by means of the first group of transistors 15.

The potential difference created between the two main bit lines causes a current (which programs one side of the cell 11) to flow through the first and second group of transistors 15, 16, the main bit lines themselves, the cell 11 and the left and right-hand selection transistors 12, 13 up to the structure 14, from which said current is sent to a current sense amplifier, not illustrated.

The voltage drops along the path of the current imply that the voltages applied to the first main bit line Main-j and to the second main bit line Main-j+1 are not the pre-established ones. In particular, in consequence of the voltage drops on the second transistor group 16, the voltage of the second main bit line Main-j+1 is greater than the ground potential, assuming for example, a value of 250 mV which was measured experimentally. Further voltage drops occur across the first left-hand selection transistor 12 (for example 850 mV) and the second right-hand selection transistor 13 (for example, 150 mV). Moreover, voltage drops occur on the resistive diffusions which make up the cell bit lines. In particular, said diffusions introduce a high drain impedance and a low source impedance for the cell 11 (or vice versa) depending on the position of the cell 11 in the array 110 in FIG. 2. Considering average contributions, a total drop for both diffusions has been estimated in, for example, 900 mV.

In the embodiment described, the potential difference between the drain and the source of the cell 11 is equal to 4.5 V, but said value is only approximate since it is an average value. In particular, said potential difference depends on the position of the cell 11 in the memory array 110 and it must be possible to adjust it in order to accurately provide the desired quantity of charge stored in the generic cell NROM being programmed. In fact, a smaller quantity of stored charge makes the erasure operation less onerous (fewer wholes are necessary to annul the electrons stored at the ends of the nitride layer), consequently increasing the number of subsequent programming-erasure cycles which can be performed on the cells.

In the described embodiment, the total voltage drop along the path of the current is approximately 7V (this value was estimated in conditions of average operation). In this case, a voltage, for example of 8V supplied by the third regulator REG3, permits a limited control of the potential difference across the cell 11 so increasing the possibility that the "Chisel effect" takes place.

For example, in order to read the left-hand bit of the cell 11, a dynamic reading operation composed of two successive steps is performed. During the first step, the first main bit line Main-j and the second main bit line Main-j+1 are placed in the ground potential (for example 0V). Subsequently, the gate terminals of the cell 11 and of the left and right-hand selection transistors 12, 13 are polarized by the first voltage regulator REG1 and the second voltage regulator REG2 respectively, while the structure 14 applies the ground potential GND to the first main bit line Main-j and the third voltage regulator REG3 applies a positive voltage (for example 1.8V) to the second main bit line Main-j+1. If the left-hand side of the cell 11 is not programmed, a high current rapidly raises the voltage of the first main bit line Main-j (logic 1). On the contrary, if said side is programmed, the small current generated is insufficient to rapidly vary the voltage of the first main bit line Main-j which, therefore, remains at the ground potential GND (logic 0).

For example, to erase the said left-hand bit of the cell 11, the fourth regulator REG4 applies the erasing voltage (for example 8V) to the first main bit line Main-j, while the second main bit line Main-j+1 remains disconnected. This occurs when the first erasing transistor Er-L conducts and the second erasing transistor Er-R is switched off. Similarly, in order to erase the bit stored in the right-hand side of the cell 11, the first erasing transistor Er-L is switched off while the second erasing transistor Er-R conducts.

The first erasing transistor Er-L and the second erasing transistor Er-R never conduct at the same time and they are both switched off during the programming and reading operations.

Generalizing the foregoing remarks to the case of a cell array similar to that shown in FIG. 2, each main bit line of the array 110 is connected to the fourth regulator REG4 by means of the first erasing transistor Er-L or the second erasing transistor Er-R. Therefore, if the first erasing transistor Er-L conducts, all the main bit lines which are connected to it are polarized to the erasing voltage, while the remaining main bit lines (connected to the second erasing transistor Er-R) are not connected. Consequently, the right or left-hand bits of all the NROM cells connected to the polarized main bit lines are erased. Subsequently, making the second erasing transistor Er-R conduct, the remaining main bit lines are polarized and erasing of the entire memory array is completed.

Figure 4:
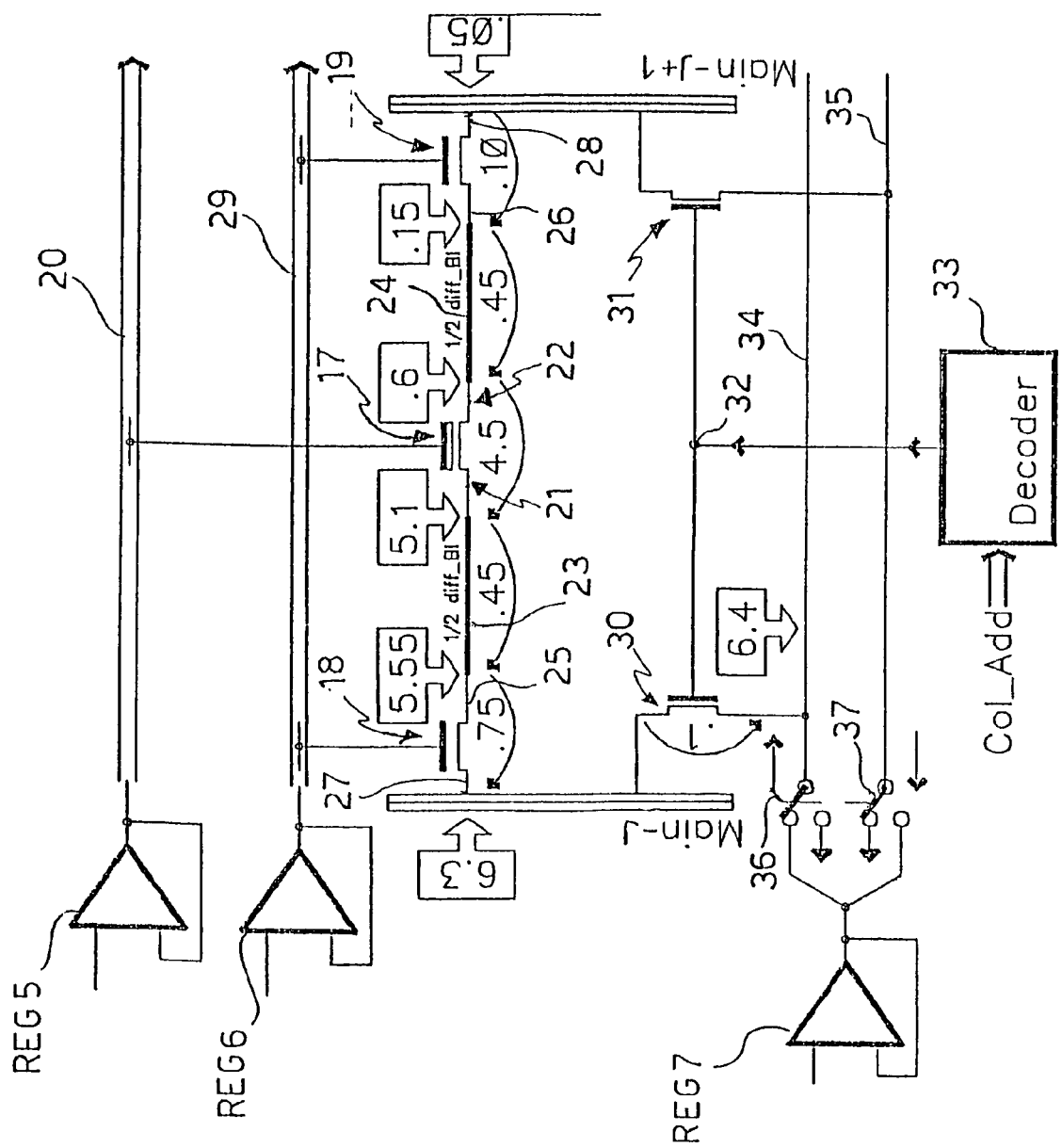
FIG. 4 shows, schematically, a simplified memory system including a single dual bit NROM cell manufactured according to an embodiment of the invention.

FIG. 4 schematically shows a simplified memory system (FIG. 4 shows one single cell) which makes it possible to illustrate the selection mode of a generic cell of the memory array 110 according to an embodiment of the present invention.

The dual bit generic NROM cell 17 in FIG. 4, has a command terminal connected to a first bus line 20 (made up of electric lines). Furthermore, a first terminal 21 and a second terminal 22 of said cell are connected to a first terminal 25 of a third selection transistor 18 and to a first terminal 26 of a fourth selection transistor 19 respectively, by means of the resistive diffusions 23, 24. The resistive diffusions 23, 24 simulate the behavior of the cell bit lines and the same remarks made during the analysis of FIG. 3 are valid also for them. The third selection transistor 18 and the fourth selection transistor 19 are upper/lower selection transistors of the array 110 and have the command terminals connected to a second bus line 29 (also made up of electric lines). Furthermore, a second terminal 27 of the selection transistor 18 is connected to a first main bit line Main-j and a second terminal 28 of the selection transistor 19 is connected to a second main bit line Main-j+1. Said main bit lines are similar to those shown in FIG. 3.

The first bus line 20 and the second bus line 29 are connected, at one end, to a fifth voltage regulator REG5 and a sixth voltage regulator REG6 respectively.

FIG. 4 also illustrates a first selection transistor 30 and a second selection transistor 31 which have the drain terminals connected to the first main bit line Main-j and the second main bit line Main-j+1 respectively and the gate terminals connected to a common node 32. The common node 32 is connected to a decoder 33. The source terminals of the transistors 30 and 31 are connected to a first electric line 34 and a second electric line 35 respectively. Finally, a switch 36 (37) connects the first (second) electric line 34 (35) selectively to the ground potential or to a seventh voltage regulator REG7.

Advantages of this embodiment compared to the prior art shown in FIG. 3 can be deduced by analyzing, also in this case, the NROM cell 17 programming steps.

In order to program a bit of the cell 17, for example the left-hand one, first of all the fifth regulator REG5 applies a positive voltage (for example 9V) to the gate terminal of said cell. Similarly, the sixth regulator REG6 applies a positive voltage (for example 10V) to the gate terminal of the third selection transistor 18 and of the fourth selection transistor 19, activating them for conduction.

With the switches 36, 37 in the positions shown in FIG. 4, the positive programming voltage (for example 8V) supplied by the seventh regulator REG7 is applied to the first electric line 34, while the second electric line 35 is fixed to the ground potential GND.

The decoder 33 receives, as an input, column address signals (Col_Add) through which it selects the main bit lines corresponding to the cell to be programmed among the plurality of main bit lines in the array. In the case under examination, the decoder 33 selects the first main bit line Main-j and the second main bit line Main-j+1 by activating the gate terminals of the first selection transistor 30 and the second selection transistor 31 respectively.

In this way, the programming voltage supplied by the seventh regulator REG7 is transferred, by means of the transistor 30, to the first main bit line Main-j and the ground potential to the second main bit line Main-j+1 by means of the transistor 31.

Similarly to the case analyzed in FIG. 3, the potential difference between the two main bit lines causes the flow of a current which gives rise to voltage drops along its path. In fact, the results of experimental measurements given in FIG. 4 confirm that the voltage applied to the second main bit line Main-j+1 is not the ground potential GND (for example 0V), but a voltage of approximately 50 mV. Further voltage drops occur across the third selection transistor 18 (for example 750 mV) and the fourth selection transistor 19 (for example 100 mV). Moreover, the average contribution of the voltage drops on the resistive diffusions 23, 24 is, for example, 900 mV.

Assuming an average voltage drop across the cell 17 equal, for example, to 4.5V, the total voltage drop along the path of the current is, for example, 6.4V. Said value is lower compared to that obtained, conditions being equal, in the case of the prior art. This demonstrates that the selection of the main bit lines by means of the decoder 33 permits greater control of the potential difference across the cell 17, so avoiding undesired spurious phenomena during programming.

Similarly to the case in FIG. 3, dynamic reading made up of two successive steps is performed to read, for example, the left-hand bit of the cell 17. During the first step, the first main bit line Main-j and the second main bit line Main-j+1 are placed at the ground potential GND (for example 0V). Subsequently, the gate terminals of the cell 17 and of the selection transistors 18,19 are polarized by the voltage regulators REG5, REG6.

The ground potential GND is applied to the first main bit line Main-j by means of the commutator 36 and the first selection transistor 30, while the reading voltage (for example 1.8 V) is applied to the second main bit line Main-j+1 by means of the commutator 37 and the second selection transistor 31. If the left-hand side of the cell 17 is not programmed, a high current rapidly raises the voltage of the first main bit line Main-j (logic 1). On the contrary, if said side is programmed the small current generated is insufficient to rapidly vary the voltage of the first main bit line Main-j which, therefore, remains at the ground potential GND (logic 0).

The structure illustrated in FIG. 4 is more simple than that of the prior art since both the voltage regulator for erasure operations and the erasing transistors Er-L and Er-R connected to the main bit lines Main-j, Main-j+1 are eliminated. This is possible since the selection of the main bit lines by means of the decoder 33 makes it possible to erase, totally or partially, the memory array.

Figure 5:
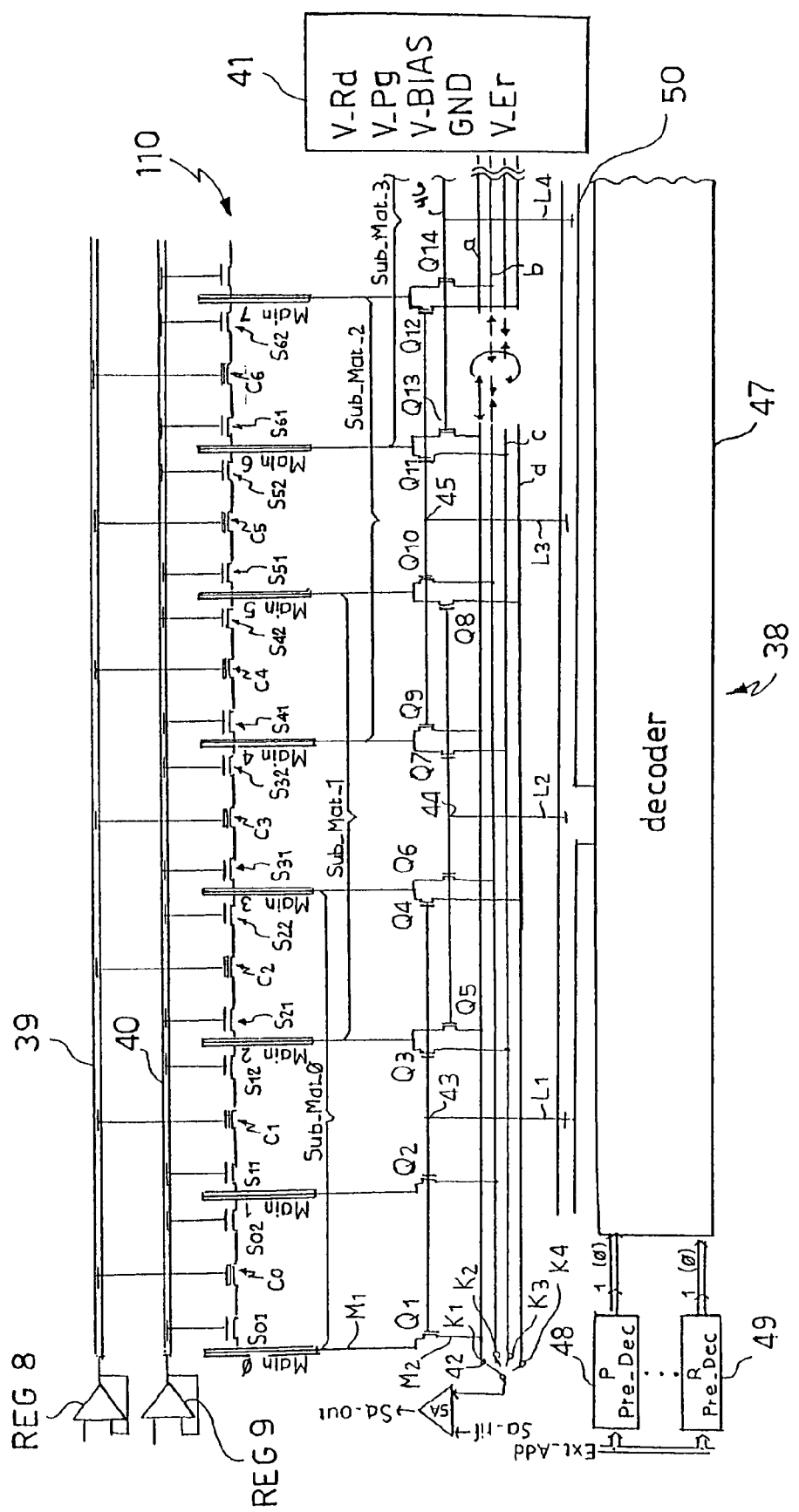
FIG. 5 shows a memory system according to an embodiment of the invention.

In order to describe in detail the operation of erasure of the memory array according to an embodiment of the invention, the memory system or structure 38 shown in FIG. 5, forming a generalization of the diagram given in FIG. 4, should be considered. Moreover, on the basis of the structure 38, it is possible to describe how the reading and programming steps are carried out in the case of an overall memory array.

The structure 38 comprises a plurality of main bit lines Main-0, Main-1, Main-2, ... Main-j, ... Main-N (with N equal to 7 in the example given) which lead to a memory array 110 similar to that illustrated in FIG. 2. In particular, the main bit lines of the structure 38 are eight, but this number can be greater depending on the size of the array.

In order to simplify the graphic representation, it has been assumed that the memory array 110 of the structure 38 is made up of a plurality of NROM cells Ci (with i varying from 0 to 6) connected between two contiguous main bit lines by means of selection transistors Si1 and Si2 (with i varying from 0 to 6). The selection transistors Si1 and Si2 are similar to the third 18 and the fourth 19 transistor shown in FIG. 4. For example, the cell C0 in series between the selection transistors S01 and S02 is connected to the main bit lines Main-0 and Main-1. The command terminals of the cells Ci are connected to a third bus line 39 comparable to a word line of the array of cells 110. The command terminals of the selection transistors Si1, Si2 are connected to a fourth bus line 40 comparable to one of the upper or lower selection lines Up-L, Up-R, Dw-L, Dw-R previously introduced. The third 39 and the fourth 40 bus lines are connected to an eighth voltage regulator REG8 and to a ninth voltage regulator REG9 respectively.

Furthermore, the memory system 38 comprises operating voltage generating means made available on four output electric lines a, b, c, d, fitted at one end with electric contacts K1, K2, K3, K4 respectively. In particular, said generating means are formed by a scrambler 41. The scrambler 41 is such as to distribute the operating voltages to the different output electric lines a, b, c, d, according to configurations which depend on the particular operation to be performed on one or more cells of the array 110 (for example, reading, programming, erasing) and their position.

A further switch 42 is provided with an output connected to one of the two inputs of a sense amplifier SA. The switch 42 is such as to connect selectively its output to one of the electric contacts K1, K2, K3, K4, depending on the particular cell to be read.

Advantageously, the memory system 38 includes groups of selection transistors Q1–Q14 which can be activated/deactivated to/from conduction by means of command lines L1, L2, L3, L4, to connect the output lines a, b, c, d, to the main bit lines Main-0–Main-7 selectively.

In greater detail, each of the first four main bit lines of the structure 38, i.e. Main-1, Main-2, Main-3 and Main-4, is connected to one of the output lines a, b, c and d by means of a first group of selection transistors Q1, Q2, Q3 and Q4. In particular, the selection transistor Q1 has a first terminal (for example the drain) connected directly to the main bit line Main-0 and a second terminal (for example the source) connected directly to the output electric line a.

It will be noted that said first terminal is intended to be connected to a cell of the matrix, while the second terminal is intended to receive a suitable operating voltage.

Furthermore, it should be observed that the words "connected directly" mean that the respective terminal of a selection transistor (for example Q1) is connected to the main bit line (for example Main-0) and to the output electric line (for example a) by means of respective electrically conductive paths (for example M1 and M2) which do not include transistors, but constitute short circuits. For example, the conductive paths M1, M2 are formed by means of metallizations.

Similarly, the terminals (for example drain and source) of the selection transistor Q2 are connected directly to the main bit line Main-1 and to the output electric line b.

The selection transistors Q3 and Q4 have a first terminal connected directly to the main bit lines Main-2 and Main-3 respectively and a second terminal connected directly to the output electric lines c and d respectively. The command terminals of the selection transistors Q1, Q2, Q3, Q4 are connected together in the node 43 and, therefore, to the same command line L1.

Similarly, the main bit line Main-2 can also be connected by means of the transistor Q5 to the electric line a, while the main bit line Main-3 can also be connected by means of the transistor Q6 to the electric line b. In particular, the transistor Q5 has a first terminal connected to the first terminal of the transistor Q3 and a second terminal connected to the electric line a, while the transistor Q6 has a first terminal connected to the first terminal of the transistor Q4 and a second terminal connected to the electric line b.

Similarly, each of the other four main bit lines of the structure 38, i.e. Main-4, Main-5, Main-6 and Main-7, can be connected to one of the electric lines a, b, c and d by means of the selection transistors Q9, Q10, Q11 and Q12. In particular, the selection transistors Q9 and Q10 have a first terminal connected directly to the main bit lines Main-4 and Main-5 respectively and a second terminal connected directly to the electric lines a and b respectively. The selection transistors Q11 and Q12 have a first terminal connected directly to the main bit lines Main-6 and Main-7 respectively and a second terminal connected directly to the electric lines c and d respectively. The command terminals of the selection transistors Q9, Q10, Q11, Q12 are connected together in the node 45 which is connected to the command line L3.

Moreover, the main bit line Main-4 can also be connected by means of the transistor Q7 to the electric line c, the main bit line Main-5 can also be connected by means of the transistor Q8 to the electric line d, the main bit line Main-6 can also be connected by means of the transistor Q13 to the electric line a and, finally, the main bit line Main-7 can also be connected by means of the transistor Q14 to the electric line b. In particular, the pairs of transistors Q7,Q9–Q8, Q10–Q11,Q13–Q12, Q14 have a first terminal in common, while the second terminal of the transistors Q7,Q8,Q13,Q14 is connected directly to the electric lines c, d, a, b, respectively. Finally, the command terminals of the selection transistors Q5, Q6, Q7, Q8 are connected together in the node 44 (and therefore to the line L2) and, similarly, the command terminals of the selection transistors Q13, Q14 and those of other two selection transistors (not shown) corresponding to further bit lines (also not shown) of the array 110 are connected together in the node 46 (and therefore to the command line L4).

The structure further comprises a decoder 47 relevant to the entire array of cells and a plurality of pre-decoding blocks, even if only two are illustrated in FIG. 5, i.e. a pre-decoding block P 48 and a pre-decoding block R 49. Both the decoder 47 and the pre-decoding blocks 48, 49 are digital blocks formed by suitable circuit architectures comprising fundamental logic gates (for example, NAND, NOR, INVERTER).

The decoder 47 is provided in output with a bus 50 including a plurality of command lines L1, L2, L3, L4 connected to the nodes 43, 44, 45, 46, respectively. The decoder 47 enables selection of the command lines L1–L4 on the basis of address signals coming from the pre-decoding blocks 48, 49 in order to activate/deactivate to/from conduction each group of selection transistors Q1-Q14.

It will be noted that the memory array 110 can be divided, from the logic-functional point of view, into a plurality of sub-matrices Sub_Mat_0-Sub_Mat_3 each of which can be accessed by a respective group of main bit lines which, in the embodiment, is composed of four main bit lines. For example, the sub-matrix Sub_Mat_0 is accessible by the main bit lines Main-0-Main-3.

Furthermore, each group of selection transistors is associated operationally to a particular sub-matrix. For example, the group Q5,Q6,Q7,Q8 is associated with the sub-matrix Sub_Mat_1.

A mode of selection of a generic main bit of the memory array on the basis of the structure 38 in accordance with an embodiment of the invention will be given below.

The decoder 47 receives, from the pre-decoding blocks 48, 49, the address of the bit lines to be selected in the form of a sequence of numeric signals (sequence of 0 and 1). In fact, the above-mentioned pre-decoding blocks carry out selection at a higher level as a result of the large number of main bit lines which are present in an array of cells. More particularly, the pre-decoding blocks 48, 49 appropriately decode the external address signals Ext_Add.

On the basis of the signals received, the decoder 47 activates for conduction the suitable selection transistors by activating the respective command terminals by means of signals at two levels: high (logic 1) and low (logic 0). For example, if the nodes 43,44,45,46, visible in FIG. 5, are polarized by the signal sequence 1,0,0,0, the transistors Q1,Q2,Q3,Q4 conduct, while all the others are blocked. In this way, only a first sub-matrix Sub_Mat_0 made up of the first four main bit lines (Main-0–Main3) is selected from the entire array.

If the decoder 47 supplies to the above-mentioned nodes, for example, the signal sequence 1,1,0,0, the transistors Q5,Q6,Q7,Q8 conduct as well as the transistors Q1,Q2,Q3, Q4. In this case, the main bit lines Main-4 and Main-5 are selected as well as the first four main bit lines. The additional bit lines Main-4 and Main-5 form, together with the main bit lines Main-2,Main-3, a second sub-matrix Sub_Mat_1. As can be seen in FIG. 5, the sub-matrices Sub_Mat_0 and Sub_Mat_1, which have the main bit lines Main-2,Main-3 in common, are linked. In the same way, if the signal sequence is 1,1,1,0 the transistors Q9,Q10,Q11,Q12 also conduct and the main bit lines Main-6 and Main-7 are selected. Consequently, the entire sub-matrix Sub_Mat_2, which is linked to the sub-matrix Sub_Mat_1, is selected by means of the main bit lines Main-4,Main-5. Finally, if the decoder 47 supplies a sequence of only high-level signals (logic 1), the entire memory array is selected, i.e. all the main bit lines and all the sub-matrices which are linked to each other.

Before examining in detail the reading, programming and erasure operations in the memory array 110 which can be accessed by means of the selection method described in FIG. 5, it is advantageous to recall a phenomenon linked to the way in which the array is formed.

In fact, as is known, in a contactless type memory array, the memory cells are contiguous, in other words, not separated by a suitable insulating region.

It should be noted that in contactless type structures, the reading signal, i.e. the current present at the drain terminal of the memory cell to be read, may be established not only in said cell but also in contiguous cells. In other words, leakage currents, possibly of a purely capacitive nature (since they lack resistive paths) may arise, due to the contiguity of the memory cells and of the cell bit lines. The leakage currents are more marked the longer the sequence of adjacent non-programmed cells.

This undesired phenomenon is known as the neighbor effect.

Moreover, in the case of dual-bit cells, the need of reading each cell in two different directions means that each current path is not unidirectional, rendering the formation of undesired paths for the reading current or sensing current even more likely.

Because of these leakage currents, the reading current, from which information on the stored data element is to be derived, may be seriously degraded. Moreover, these currents do not have constant characteristics but are dependent on the states (programmed or non-programmed) of the memory cells adjacent to the one to be read.

When said degradation arises, it not only weakens the reading signal but may be a source of misdirections during the checking steps which may follow a programming or erasure operation.

This degradation renders the use of current-sensing techniques for contactless memory arrays more critical and difficult.

In order to impede said undesired phenomenon, during reading of a memory array cell in FIG. 2, an additional signal, i.e. a biasing voltage V-Bias, is supplied to at least one cell bit line suitably contiguous to the cell bit line to which the reading voltage V_Rd is applied. Said biasing voltage V-Bias produces, between these two cell bit lines, a potential difference such as to oppose the establishment of the leakage current between the two cell bit lines.

More particularly, the closer the biasing voltage V-Bias is to the reading voltage V_Rd, the greater is the probability of achieving a condition in which the leakage current is substantially eliminated.

The table in FIG. 6 provides an embodiment illustrating how the main bit lines Main-0,Main-1,Main-2,Main-3 of the sub-matrix Sub_Mat_0 in FIG. 5 should be biased during reading, programming and erasure operations. Similar considerations can be made for the four main bit lines of each sub-matrix of the array 110.

More particularly, the table is divided into reading Rd, programming Pg and erasure Er_All sub-tables, respectively. The sub-tables Rd and Pg refer to reading and programming operations performed on one generic cell of the sub-matrix Sub_Mat_0, while the sub-table Er_All represents the innovative erasure method introduced in this embodiment of the invention.

For convenience, the following description will refer both to the cell array 110 in FIG. 2 where the main bit lines Main-0,Main-1,Main-2,Main-3 are shown and to the structure 38 in FIG. 5.

In this connection, it is assumed that one of the bits stored in the cell $Q_{44}$ of the array 110 (for example, the right-hand bit) is to be read. As seen previously, the cell under exam must first be activated by means of the word line WL-4 and, subsequently, the reading voltage V_Rd and the ground voltage GND must be applied to the cell bit lines BC-3 and BC-4. As can be seen from the first line of the reading sub-table Rd, the reading voltage V_Rd which is applied to the main bit line Main-1 by means of the electric output line b, is transferred to the BC-3 through the lower selection transistor TD-1, while the ground potential GND which is applied to the main bit line Main-2 is transferred (by means of the electric output c) to the BC-4 through the upper selection transistor TU-2.

Moreover, if the cell $Q_{43}$ (activated by the same WL-4), adjacent to the $Q_{44}$, is not programmed, the phenomenon of leakage current would arise. To avoid this, the biasing voltage V-Bias which is applied to the main bit line Main-0 (as indicated in the sub-table Rd) is transferred by the latter to cell bit line BC-2 through the upper selection transistor TU-1. Finally, the scrambler 41 leaves the output line d floating or not connected and, therefore, the last main bit line Main-3 of the sub-matrix Sub_Mat_0 is also left floating.

These biasing methods are also valid for all the cells of the column to which the cell $Q_{44}$ belongs, once they have been activated by the respective word lines.

In general, in order to read any cell whatsoever of the array 110, the sub-matrix to which the cell under exam belongs must first be identified. Subsequently, the reading voltage V_Rd is applied to a suitable main bit line of said sub-matrix, while the ground potential GND and the biasing voltage V-Bias are applied to the main bit lines adjacent to the one to which the reading voltage was applied. The fourth main bit line is not connected.

For example, in order to program one side of the cell $Q_{43}$, the procedure given in the first line of the programming sub-table Pg must be followed. In this case, after activating the cell $Q_{43}$ by means of the word line WL-4, a programming voltage V_Pg which is applied to the main bit line Main-0 is transferred to the cell bit line BC-2 through the upper selection transistor TU-1. Similarly, the ground potential GND which is applied to the Main-1 is transferred to the cell bit line BC-3 through the lower selection transistor TD-1. The remaining main bit lines, Main-2 and Main-3, are not connected.

Said procedure is also valid for all the cells of the column to which the $Q_{43}$ belongs, once the respective word lines have been activated.

In general, having identified the sub-matrix of the array to which the cell to be programmed belongs, the programming voltage V_Pg is applied to a suitable main bit line of said sub-matrix (depending on whether the right or left-hand bit is to be programmed) and the ground potential is applied to the main bit line adjacent to the one to which the reading voltage was applied. The other main bit lines of the sub-matrix are not connected.

The scrambler 41 of the structure 38 supplies the reading V_Rd, programming V-Pg and biasing V-Bias voltages, as well as the ground potential GND, to the main bit lines of the various sub-matrices linked in the array 110. More particularly, once the decoder 47 has selected the sub-matrix of the array where the cell or group of cells to be read or programmed is located, the scrambler 41 applies the above voltages to the output electric lines a,b,c,d, associated with the main bit lines of the selected sub-matrix. Furthermore, said switch 42 is connected to one of the electrical contacts K1,K2,K3,K4 so putting the corresponding output line in communication with the sense amplifier SA. The sense amplifier SA compares the intensity of said current with a reference current, discriminating the bit stored in the selected side of the cell. For example, in the case of the reading of cell $Q_{44}$ already examined, the biasing voltage V-Bias is applied to the line a, the reading voltage V_Rd is applied to the line b, the ground potential GND is applied to the line c, while the line d is floating (in other words, it is connected to an ideally infinite impedance). In this case, the commutator 42 is connected to the electrical contact K3 to detect the intensity of the reading current.

Similarly, in order to program the cell $Q_{43}$ of the previous example, the programming voltage V_Pg is applied to the output line a and the ground potential GND is applied to the line b. The electric output lines c and d are not connected or floating.

In the table in FIG. 6, the sub-table Er_All, divided into eight lines, describes the erasure method in a memory array according to an embodiment of the invention.

The first two lines of the sub-table Er_All refer to the case in which the decoder 47 selects the entire memory array (All_Sel), i.e. all the main bit lines Main-0-Main 7 (which are the bit lines visible in FIG. 2 and FIG. 5 of the embodiments). For example, in order to erase the NROM cells of the second and sixth column of the array 110, the erasure voltage V_Er is first applied to the Main-0,Main-2 and the Main-1 ,Main-3 are left floating. Subsequently, by activating the selection transistors TU-1,TU-3 and TD-0, TD-2, the voltage V_Er is applied to the cell bit lines BC-2,BC-6, while the BC-1 ,BC-5 are left floating. In this way, half of the information contained in the NROM cells of the second and sixth column is erased. Subsequently, by applying the voltage V_Er to the Main-1 ,Main-3 and leaving Main-0,Main-2 floating (keeping the transistors TU-1,TU-3,TD-0,TD-2 in conduction), erasure of all the cells of the above-mentioned columns is completed. Afterwards, if these operations are performed for all the columns in the array, taking care to apply the erasure voltage V_Er to the suitable main bit lines and activating the appropriate selection transistors, the entire memory array is erased. In fact, the sub-table Er_All illustrates a method to bias four main bit lines, but similar considerations are valid for all the main bit lines of the array.

However, with the decoder 47 it is possible to select only one portion of the array 110, i.e. a sub-matrix or a group of sub-matrices (whether linked or not). In fact, the third and the fourth lines of the sub-table Er_All refer to the selection of a sub-matrix of the memory array, for example, the sub-matrix Sub_Mat_0.

By repeating the above-described operations, the sub-matrix Sub_Mat_0 can be erased entirely or partly, so obtaining erasure at a lower hierarchical level than erasure of the entire array and which can be called word erasure.

The biasing methods described from the fifth to the eighth line of the sub-table Er_All permit erasure of a pre-determined portion of the sub-matrix Sub_Mat_0. For example, if the erasing voltage V_Er is only applied to the main bit line Main-0 (fifth line), while the others are left floating, only half of the bits of the cells connected to said main bit line (through prefixed selection transistors) are cancelled. The same thing happens by applying the erasing voltage V_Er to any other main bit line of the sub-matrix Sub_Mat_0 and leaving the remaining ones floating. Said selective erasure of the portion of a sub-matrix is called byte erasure, since it is at a lower hierarchical level than the previous ones.

As in the cases of reading and programming, in order to carry out erasure, the scrambler 41 biases the main bit lines of the sub-matrices with the voltage V_Er or leaves them floating (not connected) by means of the electric output lines a,b,c,d and the selection transistors.

The above considerations are valid for all the sub-matrices of the memory array 110 which are selected by the decoder 47, whether independently of each other or simultaneously.

An embodiment of the present invention has an advantage that the number of transistors of the selection multiplexer is lower than those in the prior art and, therefore, both the total impedance along the path of the current and the area of silicon occupied by said transistors in the integrated circuit are also lower.

In this connection, referring to FIGS. 2 and 5, it will be noted that during a reading and programming operation of a memory cell, the cell itself is inserted in a conductive path having a moderate total impedance. In fact, this conductive path does not include other transistors besides the cell itself, two upper/lower selection transistors of the plurality TU-0-TU-7, TD-0-TD-7 and two selection transistors of the plurality Q1-Q14.

Furthermore, the reduction in the number of transistors included in the conductive path is particularly significant because the selection transistors are generally bigger than the memory cells NROM.

Moreover, the erasure operation is performed with the same circuits (scrambler, electric lines, selection transistors) as those which are used for the reading and programming operations; therefore, use of the erasure regulator and relative transistors is avoided with considerable saving of room on the chip.

The erasure operation according to this embodiment of the invention also makes it possible to erase portions of the memory array selectively, i.e. sub-matrices or portions of sub-matrices, as well as the entire array, unlike the techniques of the prior art.

It should be observed that according to a particular embodiment of the memory system 38, this can also include other memory arrays (similar to the array 110) relative to other bits of a memory word, the least significant bit of which is stored by the array 110. Therefore, during a reading operation, the decoder 47, by means of suitable lines forming part of the bus 50, can simultaneously select other main bit lines forming part of said other memory arrays. In this way, reading in parallel of several bits associated with all the memory arrays is possible. The operations of programming and erasing can be performed in the same way.

The memory array 110 is typically part of an integrated circuit such as a memory circuit, which may be part of an electronic system such as a computer system.

Naturally, in order to satisfy contingent and specific requirements, a person skilled in the art may apply to the above-described selection method many modifications and variations, all of which, however, are included within the scope of protection of the invention as defined by the appended claims.

What is claimed is:

1. Semiconductor memory system comprising:
   a memory matrix including a plurality of memory cells arranged in rows and columns and connected to a plurality of column lines, each memory cell of the same column having a first and a second terminal connected to a first and a second column line respectively,
   a plurality of conduction lines which can be selectively connected to the plurality of column lines and including a first and a second conduction line which can be connected to said first and second column lines,
   generating means provided with a plurality of output lines including at least a first and a second output line to make available a first and a second reading/writing voltage respectively to be supplied to said first and second terminal,
   groups of selection transistors which can be activated/deactivated to/from conduction by means of command lines to selectively connect the plurality of output lines to the plurality of conduction lines,
   wherein each group of transistors comprises at least a first and a second transistor connected to the same command line, said first and second transistors having corresponding operative terminals connected directly to the first and to the second output lines respectively, and corresponding cell terminals connected directly to the first and to the second conduction lines respectively.

2. Memory system according to claim 1, in which said memory matrix can be divided into a plurality of sub-matrices each of which can be accessed by means of a respective group of conduction lines, and each group of transistors is associated to a respective sub-matrix to selectively connect the plurality of output lines to a group of conduction lines.

3. Memory system according to claim 2, comprising a decoder provided with input lines to receive address signals and with an output bus including said plurality of command lines, the decoder enabling selection of the command lines on the basis of said address signals to activate/deactivate to/from conduction each group of transistors.

4. Memory system according to claim 2, in which said sub-matrices have at least two conduction lines in common and are, therefore, linked.

5. Memory system according to claim 1, comprising further groups of selection transistors to connect/disconnect said plurality of conduction lines to/from the column lines.

6. Memory system according to claim 5, in which said first and second conduction lines can be connected to said first and second column lines by means of two respective selection transistors belonging to said further groups of transistors.

7. Memory system according to claim 6, in which during a reading/writing operation of a pre-established memory cell connected to said first or second column lines, said first or second output lines are connected to said first or second column lines by means of a conductive path for an electric current associated with said first and second reading/writing voltages not including other transistors besides the pre-established cell, the first and second transistor and said two selection transistors, such as to reduce the total impedance along the conductive path.

8. Memory system according to claim 1, in which said generating means are such as to leave at least one output line of said plurality of output lines floating, and are such as to also generate an erasure voltage of cells of the memory matrix.

9. Memory system according to claim 8, in which said generating means further comprise a third and a fourth output lines to make available at least one biasing voltage to be supplied to a further column line distinct from said first and second column lines, during reading of a first cell connected to them.

10. Memory system according to claim 9, in which the generating means are such as to distribute, on said plurality of output lines, the first and the second reading/writing voltages, said erasing voltage and said biasing voltage depending on the address signals which identify said first cell.

11. Memory system according to claim 2, in which each group of conduction lines associated with a respective sub-matrix comprises four conduction lines.

12. Memory system according to claim 2, in which each group of transistors associated with the respective sub-matrix comprises four transistors connected to a common command line.

13. Memory system according to claim 3, in which the decoder, making it possible to activate/deactivate each group of transistors to/from conduction, enables reading, writing and erasing operations only of predetermined sub-matrices of the memory matrix.

14. Memory system according to claim 4, in which said predetermined sub-matrices may or may not be linked.

15. Memory system according to claim 1, in which said plurality of memory cells includes non volatile NROM type cells and dual bit.

16. Memory system according to claim 1, comprising a sense amplifier to perform current type reading of at least one data element contained in each cell, said amplifier being provided with an input terminal to receive a reading current correlated to the data element and a reference terminal to receive a reference current to be compared to said reading current.

17. Memory system according to claim 16, comprising a commutator provided with:
- a plurality of inputs each connected to a respective output line of the plurality of generating means,
- an output selectively connectable to the plurality of inputs on the basis of the address signals, said output being connected to the input terminal of the sense amplifier.

18. Memory system according to claim 3, comprising a plurality of pre-decoding blocks to decode external address signals, obtaining said address signals in the form of a sequence of numerical signals.

19. Memory system according to claim 1, comprising a voltage regulator connectable to command terminals of memory cells belonging to a row of said matrix.

20. Memory system according to claim 1, in which said memory matrix is associated with a less significant bit of a memory word, said system comprising at least one further memory matrix associated with another bit of the memory word, the decoder enabling parallel reading of said bits.

21. A memory, comprising:
- a word line;
- a command line;
- first and second main column lines;
- first and second electric output lines;
- a nonvolatile memory cell having a control terminal coupled to the word line and having first and second conduction terminals respectively coupled to the first and second main column lines;
- a first selection switch having a control terminal coupled to the command line and having first and second conduction terminals respectively coupled to the first main column line and to the first electric output line; and
- a second selection switch having a control terminal coupled to the command line and having first and second conduction terminals respectively coupled to the second main column line and to the second electric output line.

22. The memory of claim 21, further comprising an address decoder operable to access the memory cell by activating the first and second selection switches via the command line.

23. The memory of claim 21, further comprising a function generator coupled to the first and second electric output lines and operable to generate a read voltage on one of the lines and a ground voltage on the other one of the lines.

24. The memory of claim 21, further comprising a function generator coupled to the first and second electric output lines and operable to generate a program voltage on one of the lines and a reference voltage on the other one of the lines.

25. The memory of claim 21, further comprising a function generator coupled to the first and second electric output lines and operable to generate an erase voltage on one of the lines and to electrically float the other one of the lines.

26. The memory of claim 21, further comprising:
- a first access transistor operable to couple the first conduction terminal of the memory cell to the first main column line; and
- a second access transistor operable to couple the second conduction terminal of the memory cell to the second main column line.

27. The memory of claim 21 wherein the first and second selection switches respectively comprise first and second selection transistors.

28. The memory of claim 21 wherein the memory cell comprises a dual-bit memory cell.

29. An electronic system, comprising:
- a memory, comprising,
  - a word line,
  - an command line,
  - first and second main column lines,
  - first and second electric output lines,
  - a nonvolatile memory cell having a control terminal coupled to the word line and having first and second conduction terminals respectively coupled to the first and second main column lines,
  - a first selection switch having a control terminal coupled to the command line and having first and second conduction terminals respectively coupled to the first main column line and to the first electric output line, and
  - a second selection switch having a control terminal coupled to the command line and having first and second conduction terminals respectively coupled to the second main column line and to the second electric output line.

* * * * *

UNITED STATES PATENT AND TRADEMARK OFFICE
CERTIFICATE OF CORRECTION

PATENT NO. : 7,023,728 B2  
APPLICATION NO. : 10/746555  
DATED : April 4, 2006  
INVENTOR(S) : Luigi Pascucci Page 1 of 1

It is certified that error appears in the above-identified patent and that said Letters Patent is hereby corrected as shown below:

On Title Page Item [30]  
Please insert the Foreign Application Priority Data as follows:  
European patent application No. 02425796.6, filed December 24, 2002

Signed and Sealed this

Tenth Day of April, 2007

JON W. DUDAS  
*Director of the United States Patent and Trademark Office*